(12) United States Patent
Griffith et al.

(10) Patent No.: US 9,165,894 B2
(45) Date of Patent: Oct. 20, 2015

(54) CASCODE CELL HAVING DC BLOCKING CAPACITOR

(71) Applicants: Teledyne Scientific & Imaging, LLC, Thousand Oaks, CA (US); The Regents of the University of California, Oakland, CA (US)

(72) Inventors: Zachary M. Griffith, Thousand Oaks, CA (US); Thomas Benjamin Reed, North Reading, MA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 77 days.

(21) Appl. No.: 13/802,127

(22) Filed: Mar. 13, 2013

(65) Prior Publication Data

US 2014/0077883 A1 Mar. 20, 2014

Related U.S. Application Data (60) Provisional application No. 61/615,078, filed on Mar. 23, 2012.

(51) Int. Cl.
| | |
|---|---|
| *H03F 1/22* | (2006.01) |
| *H01L 23/66* | (2006.01) |
| *H01L 23/48* | (2006.01) |
| *H01L 21/768* | (2006.01) |
| *H03F 3/19* | (2006.01) |
| *H01L 29/778* | (2006.01) |
| *H01L 23/482* | (2006.01) |
| *H01L 29/737* | (2006.01) |

(52) U.S. Cl.
CPC .......... *H01L 23/66* (2013.01); *H01L 21/76877* (2013.01); *H01L 21/76897* (2013.01); *H01L 23/481* (2013.01); *H01L 23/4824* (2013.01); *H01L 29/778* (2013.01); *H03F 1/22* (2013.01); *H03F 3/19* (2013.01); *H01L 29/737* (2013.01); *H01L 2924/0002* (2013.01); *H03F 1/223* (2013.01)

(58) Field of Classification Search
CPC ................. H01L 27/14634; H01L 2924/0002; H01L 2924/00; H01L 21/76877; H01L 21/76897; H01L 23/481; H01L 23/4824; H01L 23/66; H01L 27/0825; H01L 29/1062; H01L 29/737; H01L 29/747; H01L 29/76816; H03F 1/223; H03F 1/22; H03F 2200/294; H03F 2200/372; H03F 3/193; H03F 3/19; H03F 2200/451; H03F 1/26; H03F 1/32; H03F 3/195; H03F 2203/45528
USPC ............................................ 330/98, 310, 311
See application file for complete search history.

(56) References Cited

U.S. PATENT DOCUMENTS

| | | | | |
|---|---|---|---|---|
| 6,320,468 | B2 * | 11/2001 | Carroll et al. | 330/286 |
| 6,995,613 | B2 * | 2/2006 | Meck | 330/297 |
| 7,138,876 | B2 * | 11/2006 | Behzad | 330/311 |
| 8,072,272 | B2 * | 12/2011 | Zhao et al. | 330/310 |

* cited by examiner

*Primary Examiner* — Khanh V Nguyen
(74) *Attorney, Agent, or Firm* — Brooks Acordia IP Law, PC (57) ABSTRACT

A cascode gain stage apparatus includes an input transistor having an RF input node and a transistor output node, an output transistor having a transistor input node and an RF output node, and a DC blocking capacitor connected between the transistor input and transistor output nodes.

12 Claims, 7 Drawing Sheets

CASCODE CELL HAVING DC BLOCKING CAPACITOR

CROSS-REFERENCE TO RELATED APPLICATIONS

This application claims the benefit and priority of U.S. Provisional Application No. 61/615,078, filed Mar. 23, 2012 which is hereby incorporated herein by reference in its entirety for all purposes.

STATEMENT REGARDING FEDERALLY SPONSORED RESEARCH OR DEVELOPMENT

This invention was made with Government support under Prime Contract No. W911NF-08-C-0050 awarded by Defense Advanced Research Projects Agency (DARPA) and the Army Research Office. The Government has certain rights in this invention.

BACKGROUND

1. Field of the Invention

This invention relates to transistors, and more particularly to two-stage transistor gain cells and cascode amplifiers.

2. Description of the Related Art

A cascode cell, alternatively referred to as a "single gain stage amplifier" or, "two-transistor gain stage amplifier" or a cell having "two-transistor gain", or "two stages of gain," typically includes two transistors with the same current going through each. Cascode cells are advantageous for amplification of signals because they may provide relatively high-bandwidth, high gain, and good output isolation in comparison to a single transistor amplifier stage. When the cascode cell is manufactured using heterojunction bipolar transistor (HBT) technology configured with a common-emitter transistor and common-base transistor, current (IC) is shared through both transistors thus requiring appropriate voltage bias to be applied to each transistor. Commonly, ground potential is zero volts (V) and is applied to the emitter node of the common-emitter transistor.

Unfortunately, reactive parasitics at the base node of a common-base device rapidly degrade the stability margin of the cascode cell below that desired to prevent unintended instabilities with presented impedances. A need continues to exist to provide for greater stability, higher gain, and output power.

SUMMARY

A cascode gain stage apparatus includes an input transistor having an RF input node and a transistor output node, an output transistor having a transistor input node and an RF output node, and a DC blocking capacitor connected between the transistor input and transistor output nodes. The cascode gain stage apparatus may also include a shielding back metal layer disposed between the DC blocking capacitor and a substrate, the shielding back metal layer configured to electrically shield the DC blocking capacitor from the substrate. The input transistor may include a common-emitter connected transistor having a collector connected to the DC blocking capacitor. In such an embodiment, the common-emitter connected transistor may have a two-fingered emitter in communication with a ground plane, wherein the two-fingered emitter provides a low inductance path to the ground plane. A collector resistor may be in communication with the collector. The output transistor may include a common-base connected transistor having an emitter connected to the DC blocking capacitor, and the common-base connected transistor may have a two-fingered base in communication with a ground plane, wherein the two-fingered base provides a low inductance path to the ground plane. In such embodiments, an emitter resistor may be in communication with the emitter. A collector resistor may be in communication with the collector. At least one shunt capacitor may be connected between the input node and a ground plane. In one embodiment, there may be at least one shunt capacitor connected between the output node and a ground plane. The output transistor may include a common-gate connected transistor having a source connected to the DC blocking capacitor, and the common-gate connected transistor may have a two-fingered gate in communication with a ground plane to provide a low inductance path to the ground plane. The input cascode transistor may include a common-source connected transistor having a drain connected to the DC blocking capacitor. The output cascode transistor may include a common-gate connected transistor having a source connected to the DC blocking capacitor.

A cascode amplifier method may include the steps of providing a radio-frequency (RF) input to an input node of a input transistor, the input transistor having an output node, providing a first voltage bias to the output node of the input transistor, outputting an RF output from an output node of an output transistor, the output transistor having an input node, providing a second voltage bias voltage to the output node of the output transistor, the first voltage bias being different than the second voltage bias, providing a first current shunt to a ground plane for the output node of the input transistor, providing a second current shunt to the ground plane for the input node of the output transistor, and providing a DC block between the input and output paths. The input transistor may be a common-emitter connected transistor having its emitter in communication with the ground plane through a two-fingered emitter. The output transistor may be a common-base connected transistor having its base in communication with the ground plane through a two-fingered base. The method may also include electrically shielding the input and output transistors from a substrate using a shielding back metal layer disposed between a ground plane and the substrate.

A two-transistor gain stage apparatus includes an input transistor having an RF input node and a transistor output node, a output transistor having a transistor input node and an RF output node, a DC blocking capacitor connected between the transistor input node and transistor output nodes, a first DC bias path in communication with the transistor output node of the input transistor, a second DC bias path in communication with transistor input node of the output transistor, and a third DC bias path in communication with the RF output node of the output transistor. The apparatus may also include a first current shunt in communication with the transistor output node, and a second current shunt in communication with the transistor input node of the output transistor. The apparatus may also include a shielding back metal layer disposed between the DC blocking capacitor and a substrate; the shielding back metal layer configured to electrically shield the DC blocking capacitor from the substrate. The input transistor may be a common-emitter connected transistor having a collector connected to the DC blocking capacitor, and the output transistor may be a common-base connected transistor having an emitter connected to the DC blocking capacitor. In one embodiment, the input cascode transistor may be a common-source connected transistor having a drain connected to the DC blocking capacitor and the output cascode transistor may be a common-gate connected transistor having a source connected to the DC blocking capacitor.

BRIEF DESCRIPTION OF THE DRAWINGS

The components in the figures are not necessary to scale, emphasis instead being placed upon illustrating the principals of the invention. Like reference numerals designate corresponding parts throughout the different views.

DETAILED DESCRIPTION

A cascode gain stage structure is described that can provide a compact DC block in the RF path in-between input and output transistors and provide simultaneous shunt capacitance tuning to ground, permitting the critical terminal of the output transistor such as the gate of a FET or base of an HBT to be connected to low parasitic ground potential for greater stability, higher gain, and higher output power for mm-wave and sub-mm-wave amplifiers.

Figure 1:
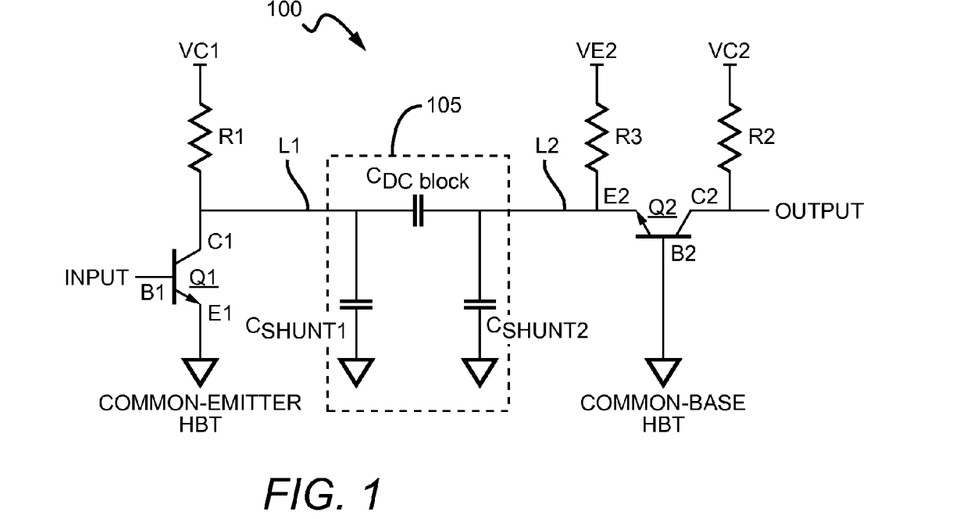
FIG. 1 is a schematic diagram of one embodiment of a two-transistor cascode cell depicting an equivalent circuit having DC blocking capability and shunt capacitance for load tuning connected between common-emitter and common-base HBT transistors.

FIG. 1 is a schematic diagram of a two-transistor cascode cell 100 having an equivalent circuit illustration connected between an input transistor and output transistor, with the equivalent circuit having DC blocking capability and shunt capacitance for load tuning. In the illustrated embodiment, the input transistor Q1 is a common-emitter connected heterojunction bipolar transistor (HBT) Q1 and the output transistor Q2 is a common-base connected HBT. As used herein, a "DC blocking capability" may mean a structure that permits no DC current to flow through it, but under the intended RF operation, an AC signal and current may be transmitted across the structure. Without reference to the equivalent circuit 105, the input transistor Q1 may be presented with either an RF or DC input at its base terminal B1 that serves as the cascode cell input node (INPUT). The input transistor Q1 may be coupled to ground at its emitter E1 to establish a common-emitter configuration. The input transistor Q1 may have an output node at its collector C1. The output transistor Q2 may have its base B2 coupled to ground to establish a common-base configuration, with its collector C2 in communication with an output node (OUTPUT) of the cascode gain stage. The input and output transistors (Q1, Q2) are illustrated as electrically connected by an equivalent circuit 105 that has a DC blocking capacitor (CDC block) connected to Q1 at its collector C1 through electrical path ("line") L1, and connected to an emitter E2 of Q2 through line L2 to provide DC blocking capability between the input and output transistors (Q1, Q2) to enable different DC bias potentials for Q1 and Q2 while maintaining RF signal capabilities.

The equivalent circuit 105 is illustrated having first and second shunt capacitances (Cshunt1, Cshunt2) to enable tuning of the current and voltage load line to put current and voltage in phase for optimal power transfer to Q2 for improved functionality of the cascode cell 100. The second shunt capacitance (Cshunt2) may be electrically connected between ground (0V) (indicated by a ground symbol ∇ in the figures) and the input of the output transistor Q1 at line L2. Similarly, the first shunt capacitance (Cshunt1) may be electrically connected between ground (0V) and the output of the input transistor Q1 at line L1. In one embodiment providing amplification of an RF signal, the input node (INPUT) of the input transistor Q1 is an RF input terminal, and the output node (OUTPUT) of the output transistor Q2 is an RF output terminal for the cascode gain stage. In such an embodiment, the first and second shunt capacitances (Cshunt1, Cshunt2) are provided to enable a predetermined center frequency of RF operation.

A bias voltage (VC1) may be provided at the collector C1 of Q1 through input resistor (R1) in order to enable Q1 to be turned on across the base B1 and emitter E1 junction and to provide for sufficient voltage swing capability at the input terminal (INPUT) of the cascode cell 100. A bias voltage (VC2) may be provided at the output node (OUTPUT) of Q2 through resistor (R2) at collector C2 and a bias voltage (VE2) may be provided at the emitter E2 of Q2 through resistor (R3) to allow Q2 to turn on and to span an AC voltage that is adequate for the designed operating voltages of the cascode cell.

In one embodiment having a cascode cell designed for use in the 220-230 GHz range and with Q2 being presented with a standard 50-ohm interface, each of the first and second shunt capacitors (Cshunt1, Cshunt2) may have an equivalent capacitive value of approximately 25-30 femtofarads (fF) and the equivalent DC blocking capacitor (CDC block) a capacitive value of approximately 160-250 fF. DC voltage bias VC1 may be +2.0 TO 2.3V, DC voltage bias VE2 may be −1.5 TO −2.0V, and DC voltage bias VC2 may be +2.0 V. E1 and B2 may be at a DC and RF potential of 0 V. In another embodiment, if a higher RF center frequency were desired, smaller equivalent shunt capacitances would be used. If a lower RF center frequency were desired, larger equivalent shunt capacitances would be used. The DC blocking capacitor (CDC block) capacitive values in such embodiments could vary approximately linearly with the capacitive values of the first and second shunt capacitors (Cshunt1, Cshunt2) (approximately a 1:10 value ratio). The transistors may be made from semiconductor materials whose lattice constant spacing is the same or similar to InP, GaN, SiGe, Si, GaAs, and include transistors of type bipolar junction transistor (BJT), hetero-junction bipolar junction transistor (HBT), field-effect transistor (FET), high-electron mobility transistor (HEMT) and metamorphic high electron mobility transistor (mHEMT)

Figure 2:
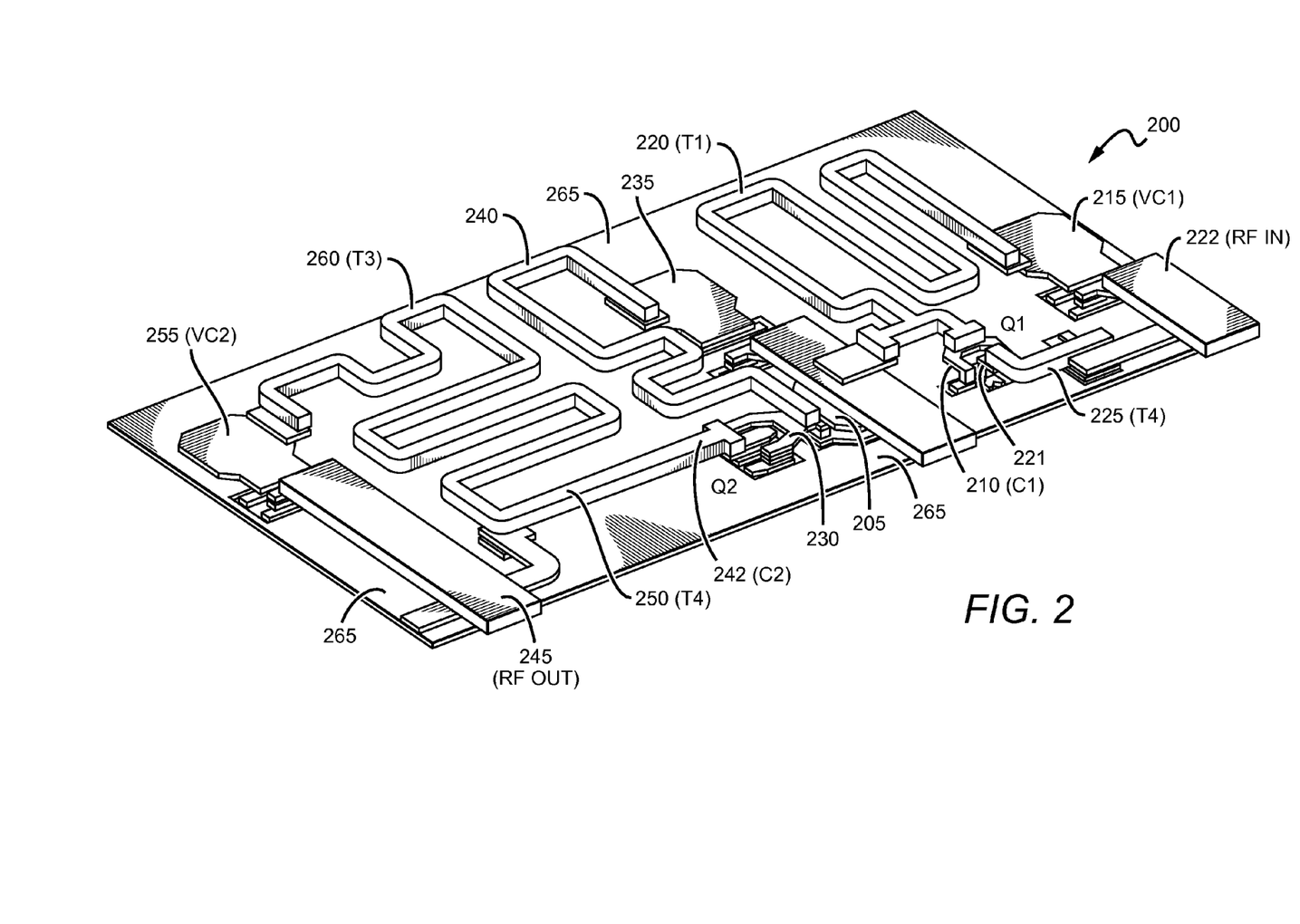
FIG. 2 is a perspective view of the two-transistor cascode cell first illustrated in schematic form in FIG. 1.

FIG. 2 is a perspective view of the two-transistor cascode cell first illustrated in schematic form in FIG. 1. The cascode cell 200 may have a thin-film metal-insulator-metal (MIM) capacitor that is a DC blocking capacitor (CDC block) 205 connected between a common-emitter connected input transistor (Q1) and a common-base connected output transistor (Q2). A portion of a first metal layer for Q1 may be a collector (C1) 210 that is in communication with a collector voltage bias pad (VC1) 215 through a quarter wave transmission line (T1) 220. A base contact metal (not shown) (see FIG. 3, 310) of Q1 is connected to a second portion of the first metal layer 221 for communication with an RF IN terminal 222 through a high Z0 transmission line (T4) 225. A two-fingered emitter (see FIG. 3, 312/313, 314/315) of Q1 has a low inductance path to the ground plane 265. Emitter fingers (not shown) (see also FIGS. 4, 312, 313, 314, and 315) of Q2 are in communication with an emitter metal 230 that is communication with the CDC block 205 and with an emitter voltage bias pad 235 through a quarter-wave transmission line (T2) 240. A collector (C2) 242 of Q2 is in communication with an RF OUT pad 245 through a high Z0 transmission line (T4) 250. The RF OUT pad 245 may also be in communication with a collector voltage bias pad (VC2) 255 through a quarter-wave transmission line (T3) 260. Q2 may have a two-fingered base (not shown) in communication with the fourth metal layer 265, and the fourth metal layer 265 may be a ground plane (see also FIGS. 3 and 4, 307a, 307b and 307c) for electrical connection to the emitter (E1) of the common-emitter transistor (Q1) and the two-fingered base (B1) of the common-base transistor.

Figure 3:
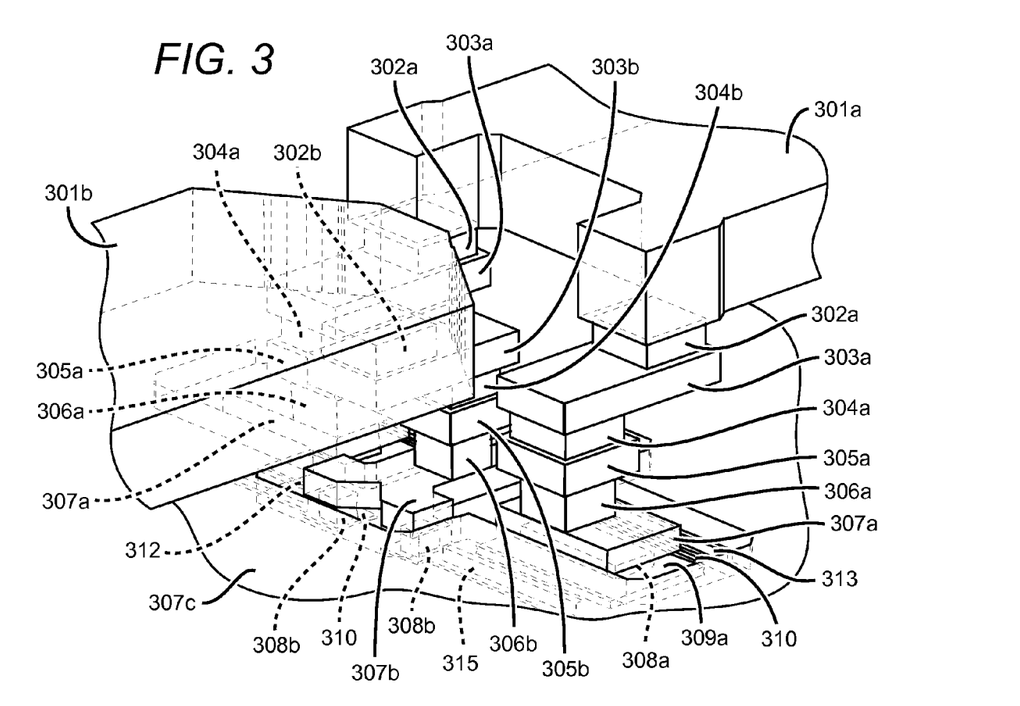
FIGS. 3 and 4 are perspective and top plan views, respectively, of the common-emitter configuration HBT first illustrated schematically in FIG. 1.
Figure 4:
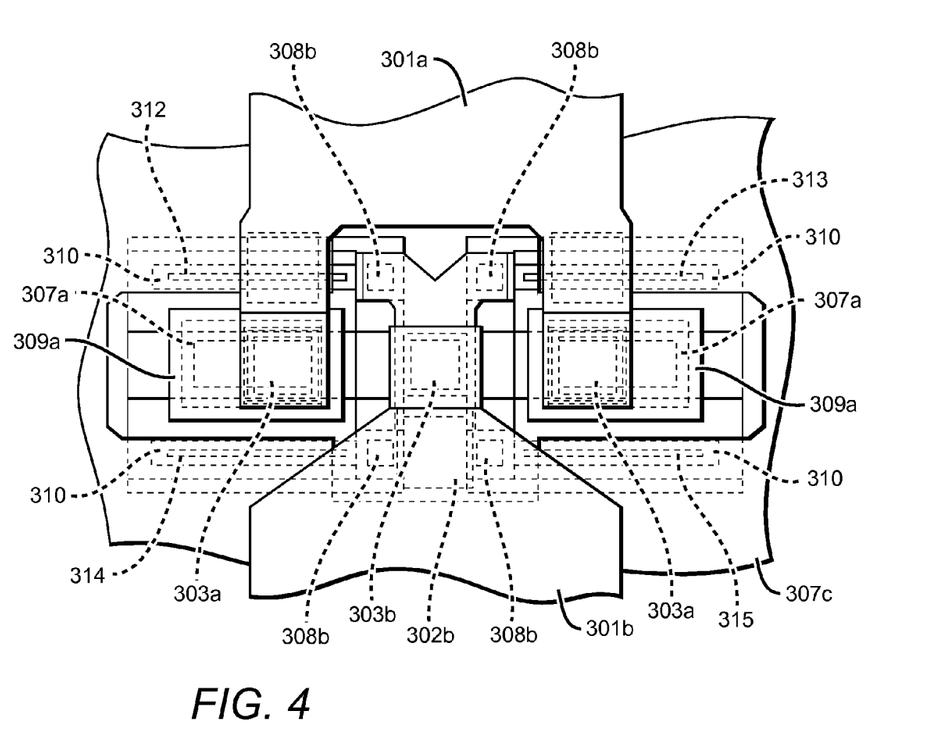

FIGS. 3 and 4 illustrate one embodiment of the common-emitter configuration HBT (Q1) first illustrated schematically in FIG. 1. In this embodiment, there may be five metal layers and interconnect vias positioned between the consecutive metal layers. As seen more clearly in FIG. 3, a first metal layer is labeled 301a and 301b, interconnect vias 302a and 302b, a second metal layer labeled 303a and 303b, interconnect vias 304a and 304b, portions of a third metal layer labeled 305a and 305b, interconnect vias 306a and 306b, portions of fourth metal layer labeled 307a, 307b and 307c, interconnect vias 308a, and 308b, and a transistor metal layer labeled 309a. Additionally, there are four transistor base-contact metals 310 and four emitter fingers. Transistor base-contact metals 310 provide connections to the transistor semiconductor, and the emitter fingers 312, 313, 314, and 315 serve as the emitters. As shown in FIGS. 3 and 4, each of these metal layers and vias are configured differently. Each metal layer, via, or emitter finger can be made of gold, copper, aluminum, or any metal exhibiting high conductivity and low loss for a DC and/or RF signal. Although two and four emitter finger configurations are described, in other embodiments either more or fewer emitter fingers or base fingers may be used in communication with a ground plane to accomplish a low inductance path to the ground plane.

In one embodiment for use in the 220-230 GHz range, the various structures may have the dimensions as described below in Table 1.

TABLE 1

| Reference numeral | X-axis (μm) | Y-Axis (μm) | Z-axis (μm) |
|---|---|---|---|
| Metal layer 301a | 12.5 | >10.0 | 3.0 |
| metal layer 301b | 12.5 | >10.0 | 3.0 |
| metal layer 303a | 3.0 | 6.3 | 1.0 |
| metal layer 303b | 3.0 | 6.3 | 1.0 |
| metal layer 305a | 3.0 | 5.8 | 1.0 |
| metal layer 305b | 2.6 | 2.6 | 1.0 |
| metal layer 307a | 4.8 | 6.7 | 1.0 |
| metal layer 307c | NA | NA | 1.0 |
| metal layer 309a | 5.8 | 3.7 | 0.3 |
| interconnect vias 302a | 2.4 | 2.4 | 1.0 |
| interconnect via 302b | 2.4 | 2.4 | 1.0 |
| interconnect vias 304a | 2.0 | 2.0 | 1.0 |
| interconnect via 304b | 2.4 | 2.4 | 1.0 |
| interconnect vias 306a | 1.6 | 1.6 | 1.0 |
| interconnect vias 308a | 4.0 | 1.5 | 0.6 |
| emitter fingers 312, 313, 314, and 315 | 0.25 | 6.0 | 0.8 |
| transistor base-contact metals 310 | 8.5 | 1.6 | 0.06 |

First metal layer 301a provides connections for an output at the collector (see FIG. 1, C1) of Q1, while first metal layer 301b provides connections for an input at the base (see FIG. 1, B1) of Q1. The input or output can be a DC and/or RF signal. As shown in FIGS. 3 and 4, the base input at first metal layer 301b connects to the transistor (Q1) at transistor base-contact metals 310 by way of the following components: first metal layer 301b, one interconnect via 302b, second metal layer 303b, one interconnect via 304b, the third metal layer 305b, one interconnect via 306b, the fourth metal layer 307b, one interconnect via 308b, and the transistor base-contact metals 310.

The transistor (Q1) collector output at first metal layer 301a connects to the transistor semiconductor at transistor metal layer 309a via the components: first metal layer 301a, two interconnect via 302a, second metal layer 303a, two interconnect vias 304a, third metal layer 305a, two interconnect vias 306a, fourth metal layer 307a, four interconnect vias 308a, and transistor metal layer 309a. Fourth metal layer 307c provides connections to emitter fingers 312, 313, 314, and 315 of the transistor, which are exposed above the BCB and accessible. Thus, as shown in FIGS. 3 and 4, fourth metal layer 307c connects to emitters by way of the following components: fourth metal layer 307c and emitter fingers 312, 313, 314, and 315 of the transistor, which are exposed above the BCB and accessible.

This novel spatial arrangement of Q1's vertical interconnects, comprising (a) metal layers 301a, 301b, 303a, 303b, 305a, 305b, 307a, 307b, 307c, and 309a, (b) vias 302a, 302b, 304a, 304b, 306a, 306b, 308a, 308b, and 310, and (c) emitter fingers 312 313, 314, and 315, reduces the effective base metal resistance along the emitter finger by approximately 75 percent, and reduces the effective base metal inductance along the emitter by more than 50 percent. Additionally, emitter fingers 312, 313, 314, and 315 are each approximately 6-m in length. Based on both x-lines and y-lines of symmetry, emitter fingers 312 and 313 effectively constitute one long emitter finger, and emitter fingers 314 and 315 effectively constitute another long emitter finger. Hence, this embodiment effectively has two long emitter fingers. These two long emitter fingers result in a significant reduction in thermal impedance, as compared to a traditional layout of a four-finger, common-emitter HBT. In addition, the connection of emitters 312, 313, 314, and 315 directly to the large fourth metal layer 307c provides an effective secondary path for heat flow from the transistor, which decreases and improves the transistor thermal impedance by 20-25 percent.

Figure 5:
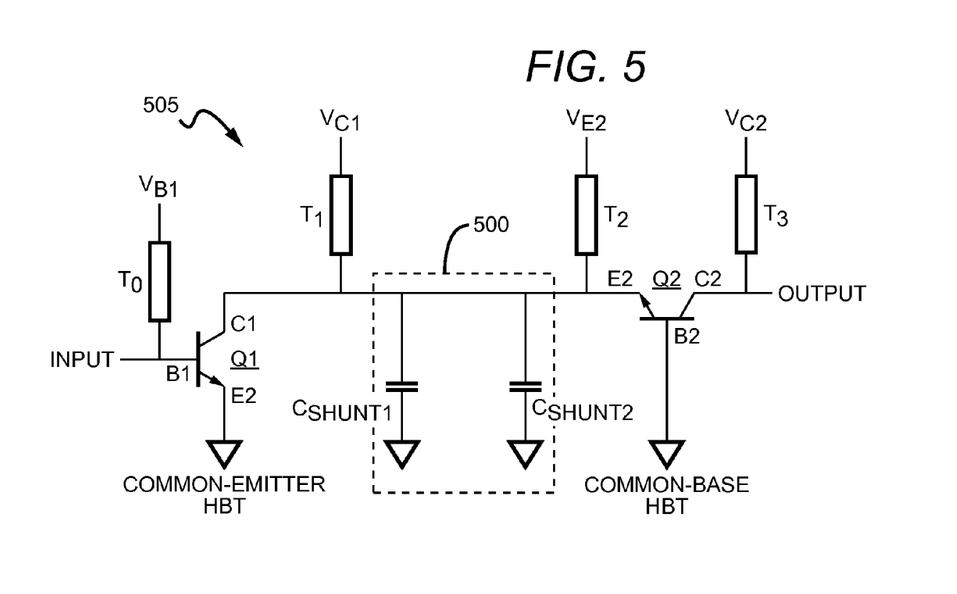
FIG. 5 is a schematic diagram of the two-transistor cascode cell first illustrated in FIG. 1, with the equivalent circuit depicting an RF signal applied at the INPUT terminal of the cascode cell.

FIG. 5 is a schematic diagram of the two-transistor cascode cell 100 first illustrated in FIG. 1, but with an equivalent circuit that depicts the result of an RF signal applied at the INPUT terminal of the cascode cell 500. As illustrated in FIG. 1, the input transistor Q1 is a common-emitter connected HBT transistor and the output transistor Q2 is a common-base connected HBT. The input transistor Q1 may have an output node at its collector C1. The base B1 and collector C1 of input transistor Q1 may be biased with DC voltages VB1 and VC1, respectively, through ¼ wave transmission lines T0 and T1, respectively, to allow Q1 to turn on and to span an AC voltage that is adequate for the designed operating voltages of the cascode cell 505. The output transistor Q2 may have its collector C2 in communication with the output node (OUTPUT) of the cascode gain stage, with its emitter E2 and collector C2 biased with a DC voltage bias of VE2 and VC2, respectively, through ¼ wave transmission lines T2 and T3, respectively. The equivalent circuit 500 is illustrated having first and second shunt capacitances (Cshunt1, Cshunt2) to tune the current and voltage load line to put current and voltage in phase for optimal power transfer to Q2 for improved functionality of the cascode cell 505. The equivalent circuit 500 would otherwise have an illustrated CDC block (see FIG. 1) but for depiction of the cascode cell 505 at the center of its designed operating frequency for the RF input.

Figure 6:
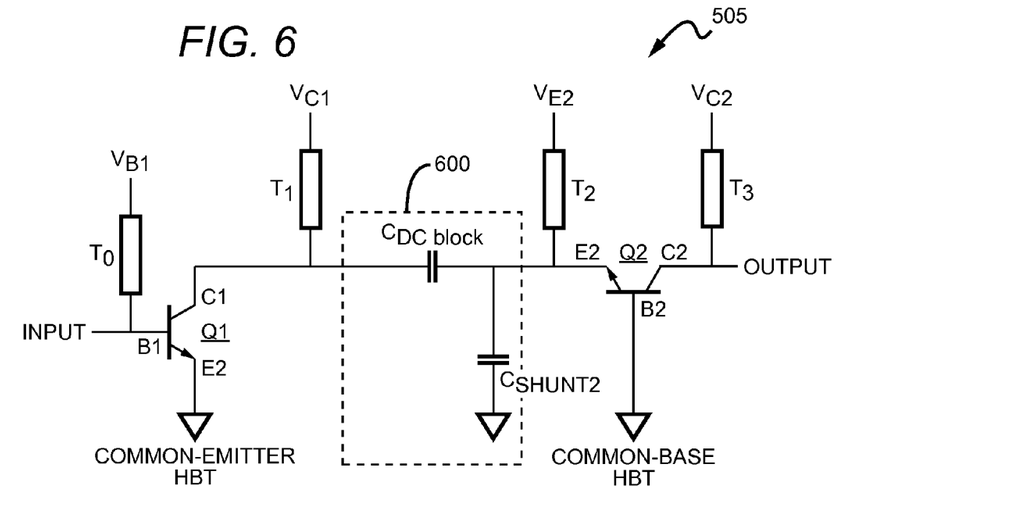
FIG. 6 is a schematic diagram of the two-transistor cascode cell first illustrated in FIG. 1, with the equivalent circuit depicting a DC signal applied at the INPUT terminal of the cascode cell.

FIG. 6 is a schematic diagram of the two-transistor cascode cell first illustrated in FIG. 1, but with an equivalent circuit 600 that depicts the result of a DC signal applied at the INPUT terminal of the cascode cell 100. The input and output transistors (Q1, Q2) are configured as illustrated in FIGS. 1 and 5, but the equivalent circuit is depicted as having DC blocking capacitor (CDC block) and shunt (i.e., "tuning") capacitor CSHUNT2 connected between ground and the emitter E2 of the output transistor Q2.

Figure 7:
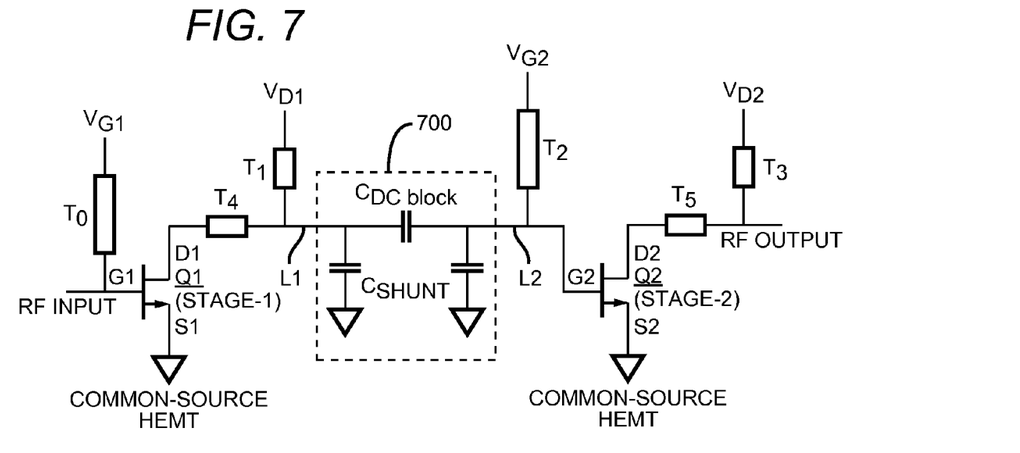
FIG. 7 is a schematic diagram illustrating one embodiment of a two-transistor gain cell having DC blocking capability and shunt capacitance for load tuning connected between common-source high electron mobility transistor (HEMT) transistors.

FIG. 7 is a schematic diagram illustrating an embodiment of a two-transistor gain cell, with the equivalent circuit depicted as connected between common-source HEMT transistors. In the illustrated embodiment, the input transistor is a common-source connected HEMT transistor (Q1) and the output transistor is a common-source connected HEMT transistor (Q2). The input transistor Q1 may be coupled at its gate G1 to gate DC voltage bias VG1 through a ¼-wave transmission line T0. A drain D1 of Q1 is coupled to a drain DC voltage bias of VD1 through a ¼-wave transmission line T1 and a high impedance line T4. The output transistor Q2 may be coupled at its drain D2 to an RF OUPUT terminal through a high-impedance transmission line T5 and to a drain DC voltage bias VD2 through the high-impedance transmission line T5 and a ¼-wave transmission line T3. A gate G2 of the output transistor Q2 may be coupled to a gate DC voltage bias VG2 through a ¼-wave transmission line T2. The input and output transistors (Q1, Q2) are illustrated as electrically connected by an equivalent circuit 700 that has a DC blocking capacitor (CDC block) connected to Q1 at its drain D1 through L1, and connected to the gate G2 of Q2 through line L2 to provide DC blocking capability between the input and output transistors (Q1, Q2) to enable different DC bias potentials for Q1 and Q2 while maintaining RF signal capabilities.

Figure 8:
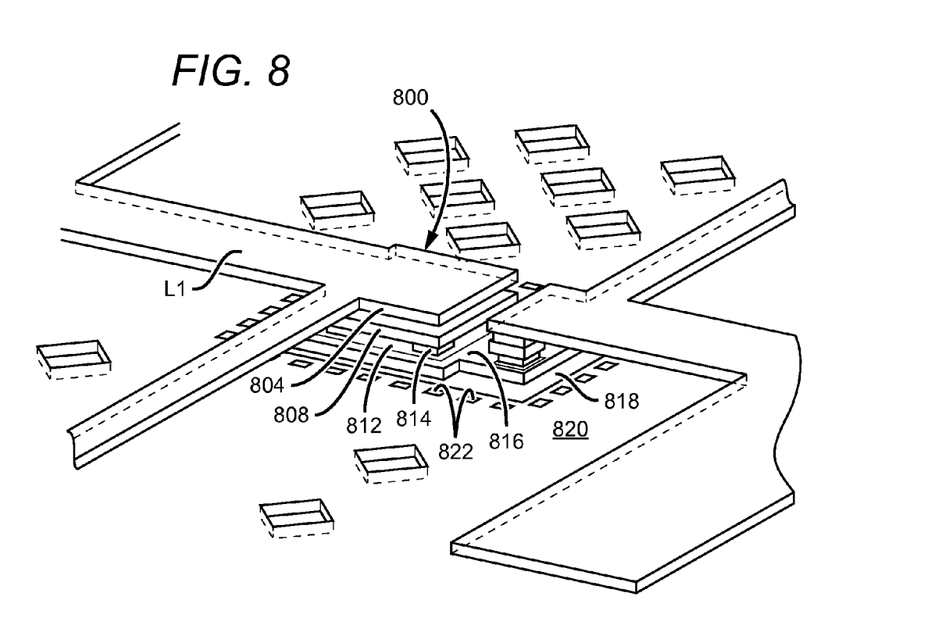
FIG. 8 is a perspective view of the two-HEMT transistor cascode cell first illustrated in schematic form in FIG. 7.

FIG. 8 is a perspective view of one embodiment of the DC blocking capacitor (CDC block) first illustrated in equivalent schematic form in FIG. 7. In the following description, the structure is described as having second, third, intermediate and fourth metal layers to form CDC block 800, although other numbered nomenclature may be used to identify the metal layers. A portion of a second metal layer 804 is configured as line L1 for communication to the drain D1 of the input transistor Q1 (see FIG. 7), and is in communication with third metal layer 808 through a plurality of conductive vias (not shown). The third metal layer 808 may be in communication with a MIM cap metal 812. MIM cap metal 812 may be disposed in complementary opposition and insulated from fourth metal layer 816 by an insulating layer (not shown), with the MIM cap metal 812, insulating layer (not shown) and fourth metal layer 816 forming a DC blocking capacitor. A shielding back metal layer 818 is spaced apart from the fourth metal layer 816 of the DC blocking capacitor to electrically shield the components from a substrate (not shown). A second portion 820 of the fourth metal layer is in communication with the shielding back metal layer 818 through a plurality of stitching vias 822 spaced apart and disposed about a perimeter of the DC blocking capacitor structure 800. The fourth metal layer 816 and shielding back metal layer 818 may form a shunt capacitor that is in communication with the second portion 820 of the fourth metal layer through the stitching vias 822 to provide a current shunt functionality.

Figure 9:
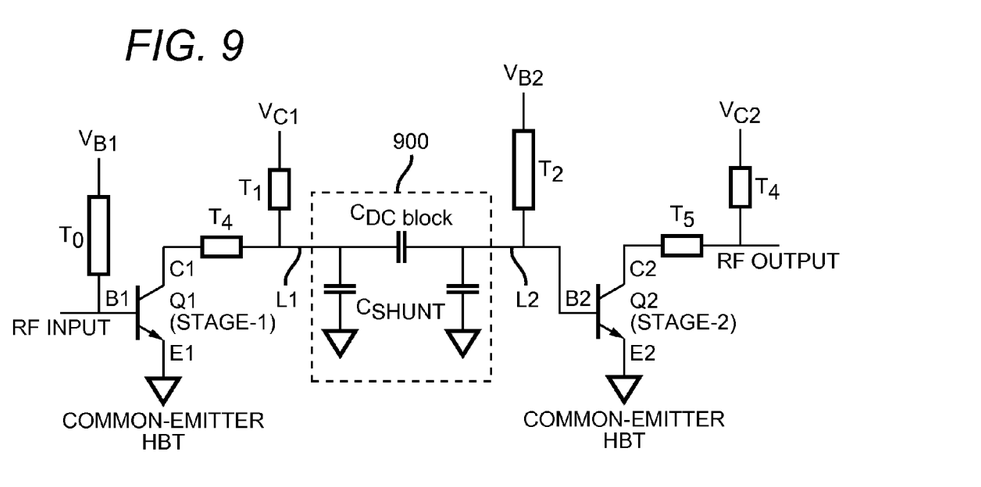
FIG. 9 is a schematic diagram illustrating one embodiment of a two-transistor gain cell having DC blocking capability and shunt capacitance for load tuning connected between common-emitter HBT transistors.

FIG. 9 is a schematic diagram illustrating another embodiment of a two-transistor gain cell, with the equivalent circuit depicted as connected between common-emitter HBT transistors. In the illustrated embodiment, the input and output transistors (Q1, Q2) are a common-emitter connected heterojunction bipolar transistors (HBT). The input transistor Q1 may be coupled at its base B1 to a base DC voltage bias VB1 through a ¼-wave transmission line T0. A collector C1 of Q1 may be coupled to a collector DC voltage bias of VC1 through a ¼-wave transmission line T1 and a high impedance line T4. The output transistor Q2 may be coupled at its collector C2 to an RF OUPUT terminal through a high-impedance transmission line T5, and to a collector DC voltage bias VC2 through the high-impedance transmission line T5 and a ¼-wave transmission line T4. A base B2 of the output transistor Q2 may be coupled to a base DC voltage bias VB2 through a ¼-wave transmission line T2. The input and output transistors (Q1, Q2) are illustrated as electrically connected by an equivalent circuit 900 that may have a DC blocking capacitor (CDC block) connected to Q1 at its collector C1 through L1, and connected to the base B2 of Q2 through line L2 to provide DC blocking capability between the input and output transistors (Q1, Q2) to enable different DC bias potentials for Q1 and Q2 while maintaining RF signal capabilities.

Figure 10:
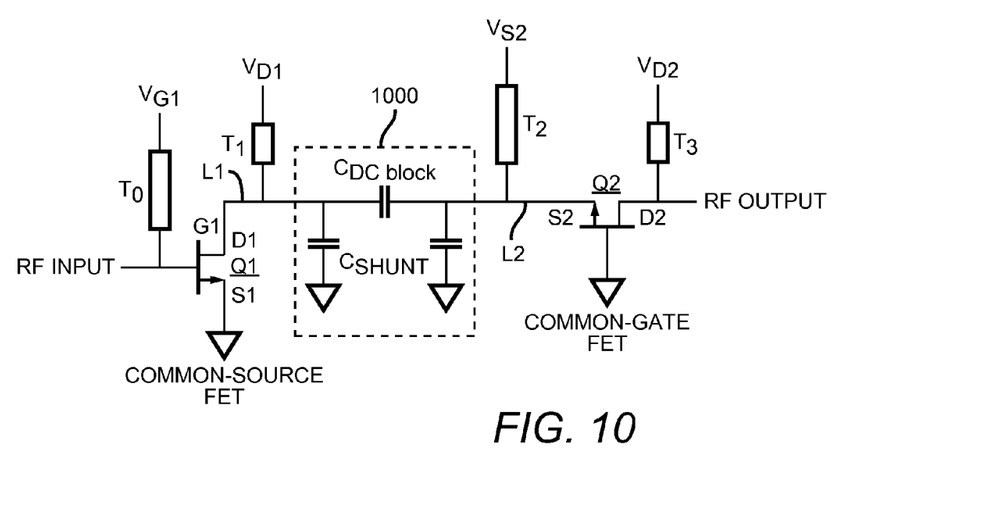
FIG. 10 is a schematic diagram illustrating one embodiment of a two-transistor cascode cell having an equivalent circuit depicting DC blocking capability and shunt capacitance for load tuning connected between common-source and common-gate HEMT transistors.

FIG. 10 is a schematic diagram illustrating another embodiment of a two-transistor cascode cell, with the equivalent circuit depicted as connected between common-source and common-gate connected field-effect transistors (FET). The input transistor Q1 may be coupled at its gate G1 to gate DC voltage bias VG1 through a ¼-wave transmission line T0. A drain D1 of Q1 is coupled to a drain DC voltage bias of VD1 through a ¼-wave transmission line T1. The output transistor Q2 may be coupled at its drain D2 to an RF OUTPUT terminal and to a drain DC voltage bias VD2 through a ¼-wave transmission line T3. A source S2 of the output transistor Q2 may be coupled to a source DC voltage bias VS2 through a ¼-wave transmission line T2. Analogous to the two-fingered emitter illustrated in FIG. 3, the gate of output transistor Q2 may be a two-fingered gate in communication with a ground plane to provide a low inductance path to the ground plane. Additional support for this structure may be found in U.S. application Ser. No. 13/719,048 filed Dec. 18, 2012 and entitled, "Method and Apparatus For Reduced Parasitics and Improved Multi-Finger Transistor Thermal Impedance," and such application is incorporated by reference for all purposes. The input and output transistors (Q1, Q2) are illustrated as electrically connected by an equivalent circuit 1000 that has a DC blocking capacitor (CDC block) connected to Q1 at its drain D1 through L1, and connected to the source S2 of Q2 through line L2 to provide DC blocking capability between the input and output transistors (Q1, Q2) to enable different DC bias potentials for Q1 and Q2 while maintaining RF signal capabilities.

Figure 11:
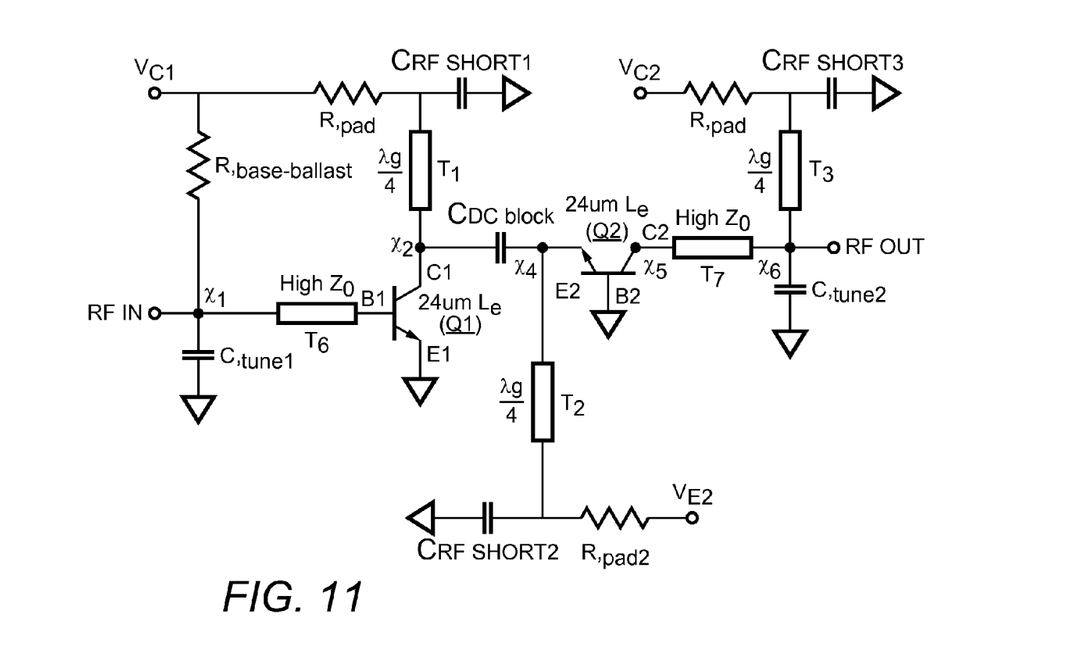
FIG. 11 is a circuit diagram illustrating one embodiment of a two-transistor cascode cell having DC blocking capability.

FIG. 11 is a circuit diagram illustrating one embodiment of a two-transistor cascode cell having DC blocking capability. An RF IN terminal is in communication with a High Z0 (high impedance) transmission line T4 and a shunt capacitor (C,tune1) through node X1 to modify and translate the impedance so that the RF IN terminal sees a 50 ohm impedance at the frequency of operation to provide maximum gain for the cascode cell. A biasing voltage terminal (VC1) is in communication with node X1 through a ballast resistor (R, base-ballast) to turn on the common-emitter connected transistor (Q1), with the ballast resistor (R, base-ballast) configured large enough to provide thermal bias stability for Q1. A DC blocking capacitor (CDC block) and ¼-wave transmission line T1 are coupled to the collector of Q1 through node X2, with CDC block separating the DC bias between the common-emitter device Q1 and the common-base device Q2. Transmission line T1 is coupled to ground through an RF short capacitor (CRF SHORT1), with CRF SHORT1 configured to short circuit to ground potential at the frequencies of interest. The transmission line T1 is in communication with the collector biasing voltage terminal (VC1) through padding resistor (R,pad1), with R,pad configured to provide some resistive dampening to Q1 at lower frequencies that without may otherwise cause Q1 to oscillate.

Similarly, a common-base connected transistor (Q2) is in communication at its emitter with a ¼-wave transmission line T2 and with the DC blocking capacitor (CDC block) through node X4. The ¼-wave transmission line T2 is coupled to ground through an RF short capacitor (CRF SHORT2), with CRF SHORT2 configured to short circuit to ground potential at the frequencies of interest. The ¼-wave transmission line T2 is also in communication with the emitter biasing voltage terminal VE2 through a padding resistor (R,pad2), with R,pad2 configured to provide resistive dampening of Q2 at lower frequencies that without may otherwise cause Q2 to oscillate. An RF OUT terminal is in communication with a ¼-wave transmission line T3 and a shunt capacitor (C, tune3) through node X6. RF OUT is also in communication with Q2 through a high-impedance transmission line T7, with the various components configured to obtain maximum RF output power rather than maximum gain. With the high impedance transmission lines (T6, T7) and shunt capacitors (C,tune1; C,tune2) configured appropriately, the ¼-wave transmission lines (T1, T3) do not appear to electrically exist at the frequencies of interest.

Figure 12:
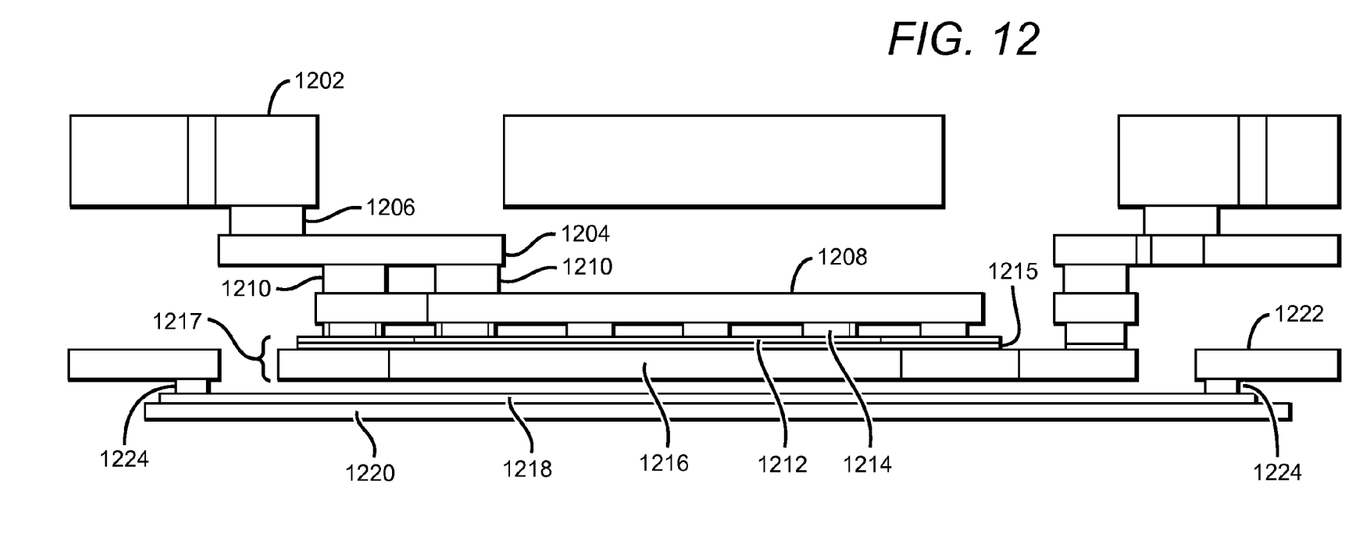
FIG. 12 is a cross section view of one embodiment of a DC blocking capacitor (CDC block) that may be used with a two-transistor cascode cell that has common-emitter HBT input and output transistors.

FIG. 12 is a block diagram illustrating one embodiment of portions of the first, second, third, intermediate and fourth metal layers and associated interconnects forming a DC blocking capacitor (CDC block) and shunt (i.e., "tuning") capacitor CSHUNT2 connected between the input and output transistors (Q1, Q2). A portion of first metal layer 1202 may be configured as line L1 for communication to the collector C1 of the input transistor Q1 (see FIG. 2), and may be in communication with second metal layer 1204 through conductive via 1206. The second metal layer 1204 may be in communication with third metal layer 1208 through a plurality of conductive vias 1210. The third metal layer 1208 may be in communication with a MIM cap metal layer 1212 through conductive vias 1214. The MIM cap metal layer 1212 may be disposed in complementary opposition to and insulated from a fourth metal layer 1216 by an insulating layer 1215, with the MIM cap metal layer 1212, insulating layer 1215, and fourth metal layer 1216 forming a DC blocking capacitor 1217. A shielding back metal layer 1218 is spaced apart from the fourth metal layer 1216 of the DC blocking capacitor to electrically shield the components from a substrate 1220. A second portion 1222 of the fourth metal layer is in communication with the shielding back metal layer 1218 through a plurality of stitching vias 1224. The fourth metal layer 1216 and shielding back metal layer 1218 may form a shunt capacitor 1226 that is in communication through the stitching vias 1224 with the second portion 1222 of the fourth metal layer to provide a current shunt functionality.

During operation with an RF input that is centered at the designed frequency, the MIM cap metal layer 1212 and the fourth metal layer 1216 are effectively short-circuited as illustrated in the equivalent circuit 500 of FIG. 5. However, below the design frequencies, the MIM cap metal layer 1212 and the fourth metal layer 1216 are effectively open circuited as illustrated in the equivalent circuit 600 of FIG. 6.

While various implementations of the application have been described, it will be apparent to those of ordinary skill in the art that many more embodiments and implementations are possible that are within the scope of this invention.

What is claimed, is:

1. A cascode gain stage, comprising:
   an input transistor having an RF input node and a transistor output node;
   an output transistor having a transistor input node and an RF output node;
   a DC blocking capacitor connected between the transistor input and transistor output nodes; and
   a shielding back metal layer disposed between the DC blocking capacitor and a substrate, the shielding back metal layer configured to electrically shield the DC blocking capacitor from the substrate.

2. A cascode gain stage apparatus, comprising:
   an input transistor comprising a common-emitter connected transistor having a collector connected to the DC blocking capacitor, the input transistor having an RF input node and a transistor output node;
   an output transistor having a transistor input node and an RF output node; and
   a DC blocking capacitor connected between the transistor input and transistor output nodes;
   wherein the common-emitter connected transistor has a two-fingered emitter in communication with a ground plane, wherein the two-fingered emitter provides a low inductance path to the ground plane.

3. The apparatus of claim 2, further comprising a collector resistor in communication with the collector.

4. The apparatus of claim 3, wherein the output transistor comprises a common-base connected transistor having a two-fingered base in communication with a ground plane, wherein the two-fingered base provides a low inductance path to the ground plane.

5. A cascode gain stage apparatus, comprising:
   an input transistor having an RF input node and a transistor output node;
   an output transistor having a transistor input node and an RF output node, the output transistor comprising a common-base connected transistor having an emitter connected to the DC blocking capacitor; and a DC blocking capacitor connected between the transistor input and transistor output nodes;
wherein the common-base connected transistor has a two-fingered base in communication with a ground plane, wherein the two-fingered base provides a low inductance path to the ground plane.

6. The apparatus of claim 5, further comprising:
an emitter resistor in communication with the emitter.

7. The apparatus of claim 5, further comprising:
a collector resistor in communication with the collector.

8. A cascode amplifier method, comprising:
providing a radio-frequency (RF) input to an input node of an input transistor, the input transistor having an output node;
providing a first voltage bias to the output node of the input transistor;
outputting an RF output from an output node of a output transistor, the output transistor having an input node;
providing a second voltage bias voltage to the output node of the output transistor, the first voltage bias being different than the second voltage bias;
providing a first current shunt to a ground plane for the output node of the input transistor;
providing a second current shunt to the ground plane for the input node of the output transistor; and
providing a DC block between the input and output paths;
wherein providing the DC block between the input and output paths enables different first and second voltage biases to be provided; and
wherein the input transistor comprises a common-emitter connected transistor having its emitter in communication with the ground plane through a two-fingered emitter.

9. The method of claim 8, wherein the output transistor comprises a common-base connected transistor having its base in communication with the ground plane through a two-fingered base.

10. A cascode amplifier method, comprising:
providing a radio-frequency (RF) input to an input node of an input transistor, the input transistor having an output node;
providing a first voltage bias to the output node of the input transistor;
outputting an RF output from an output node of a output transistor, the output transistor having an input node;
providing a second voltage bias voltage to the output node of the output transistor, the first voltage bias being different than the second voltage bias;
providing a first current shunt to a ground plane for the output node of the input transistor;
providing a second current shunt to the ground plane for the input node of the output transistor; and
providing a DC block between the input and output paths; and
electrically shielding the input and output transistors from a substrate using a shielding back metal layer disposed between a ground plane and the substrate;
wherein providing the DC block between the input and output paths enables different first and second voltage biases to be provided.

11. A two-transistor gain stage apparatus, comprising:
an input transistor having an RF input node and a transistor output node;
an output transistor having a transistor input node and an RF output node;
a DC blocking capacitor connected between the transistor input node and transistor output node;
a first DC bias path in communication with the transistor output node of the input transistor;
a second DC bias path in communication with transistor input node of the output transistor;
a third DC bias path in communication with the RF output node of the output transistor;
a first current shunt in communication with the transistor output node; and
a second current shunt in communication with the transistor input node.

12. A two-transistor gain stage apparatus, comprising:
an input transistor having an RF input node and a transistor output node;
an output transistor having a transistor input node and an RF output node;
a DC blocking capacitor connected between the transistor input node and transistor output node;
a first DC bias path in communication with the transistor output node of the input transistor;
a second DC bias path in communication with transistor input node of the output transistor;
a third DC bias path in communication with the RF output node of the output transistor; and
a shielding back metal layer disposed between the DC blocking capacitor and a substrate, the shielding back metal layer configured to electrically shield the DC blocking capacitor from the substrate.

* * * * *